(12) United States Patent
Nedovic

(10) Patent No.: US 8,674,773 B2
(45) Date of Patent: Mar. 18, 2014

(54) PHASE INTERPOLATOR WITH VOLTAGE-CONTROLLED OSCILLATOR INJECTION-LOCK

(75) Inventor: Nikola Nedovic, San Jose, CA (US)

(73) Assignee: Fujitsu Limited, Kawasaki-shi (JP)

( * ) Notice: Subject to any disclaimer, the term of this patent is extended or adjusted under 35 U.S.C. 154(b) by 0 days.

(21) Appl. No.: 13/363,260

(22) Filed: Jan. 31, 2012

(65) Prior Publication Data

US 2013/0194044 A1    Aug. 1, 2013

(51) Int. Cl.
*H03B 27/00*    (2006.01)
(52) U.S. Cl.
USPC ............... 331/45; 331/57; 327/156; 327/159; 375/371
(58) Field of Classification Search
USPC ............... 331/57, 1 A, 16, 45; 327/156, 159; 375/371
See application file for complete search history.

(56) References Cited

U.S. PATENT DOCUMENTS 6,509,773 B2    1/2003    Buchwald

OTHER PUBLICATIONS

Takauchi, H. et al., "A CMOS Multichannel 10-Gb/s Transceiver", *IEEE JSSC*, vol. 38, No. 12, p. 2094-2100, Dec. 2003.
Larsson, P. "A 2-1600-MHz CMOS Clock Recovery PLL with Low-Vdd Capability", *IEEE JSSC*, vol. 34, No. 12, Dec. 1999.
Palermo, S. et al, "A 90 nm CMOS 16 Gb/s Transceiver for Optical Interconnects" *JSSC*, vol. 43, No. 5, pp. 1235-1246, May 2008.
Hanumolu, P. et al., "A Wide-Tracking Range Clock and Data Recovery Circuit", *IEEE JSSC*, vol. 43, No. 2, p. 425-439, Feb. 2008.

*Primary Examiner* — Arnold Kinkead
(74) *Attorney, Agent, or Firm* — Baker Botts L.L.P.

(57) ABSTRACT

In one embodiment, one or more circuits convert an n-bit control code of a phase interpolator to a coupling control signal of k-bit wide. The one or more circuits couple one or more output signals of the phase interpolator to a reference clock of the phase interpolator based on the coupling control signal.

13 Claims, 6 Drawing Sheets

PHASE INTERPOLATOR WITH VOLTAGE-CONTROLLED OSCILLATOR INJECTION-LOCK

TECHNICAL FIELD

This disclosure generally relates to phase interpolators.

BACKGROUND

A phase interpolator outputs periodical signals based on a set of reference signals and a control signal. The control signal controls the phases of the output signals, and is typically a digital signal. A phase interpolator with a digital control signal produces output signals having discrete phases. Phase interpolators may be used in a variety of systems, such as radio frequency (RF) receivers, and Plesiochronous or Mesochronous communications systems.

Injection-lock refers to a phenomena when a first signal is coupled to a second signal while the two signals having similar but different frequencies (or phases), the coupling may cause the frequency (or phase) of the second signal to be essentially identical to the frequency (or phase) of the first signal.

DESCRIPTION OF EXAMPLE EMBODIMENTS

A phase interpolator outputs periodical signals based on a set of reference signals and a control signal. Each reference signal has an amplitude and a phase. Hereafter, let $\phi$ denote the phase (in degrees (°)) of a signal. The control signal controls the phases of the output signals. The functionality of the phase interpolator is to set the phase of an output signal to track the digital control code provided by the control signal at its input.

Figure 1:
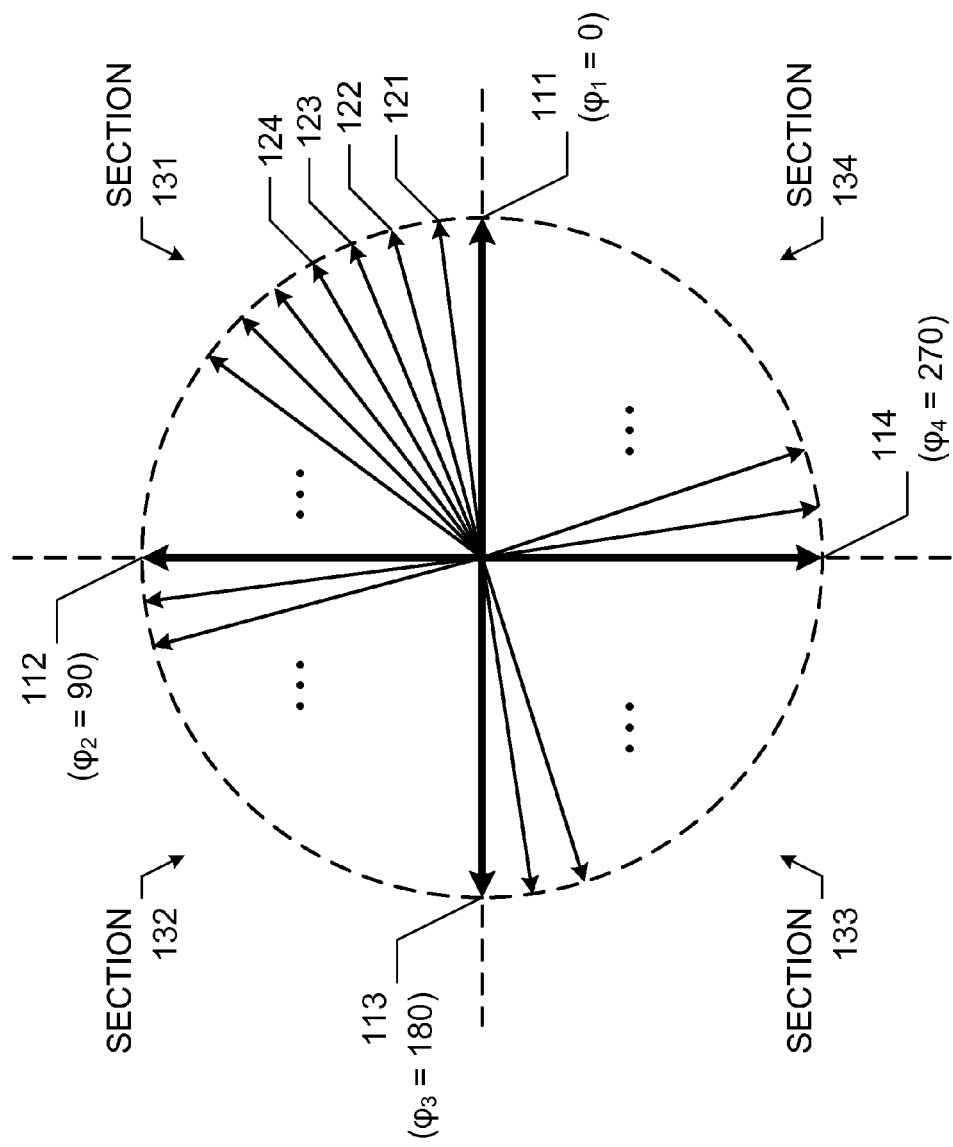
FIG. 1 illustrates an example phase interpolator having a phase range of 360° and four reference signals, and output signals having a number of phases.

FIG. 1 illustrates output signals of an example phase interpolator. In this case, the phase range, denoted as P, of the phase interpolator is 360° (i.e., 0≤P<360); that is, the phase interpolator is capable of providing output signals having a phase that belongs to a set of discrete phases in range between 0° and 360°. For a phase interpolator having a phase range of 360°, the minimum number of reference signals the phase interpolator needs is three, but such a phase interpolator can have any number of reference signals that is greater than or equal to three (e.g., three, four, six, etc.). Often, for practical reasons, four reference signals are used with a phase interpolator having a phase range of 360°. As illustrated in FIG. 1, four reference signals, denoted as 111, 112, 113, and 114, each can have a fixed amplitude and a fixed phase. More specifically, reference signal 111 has a fixed phase of 0°; reference signal 112 has a fixed phase of 90°; reference signal 113 has a fixed phase of 180°; and reference signal 114 has a fixed phase of 270°. In addition, each reference signal 111, 112, 113, 114 has a fixed amplitude, and in this case, the four reference signals 111, 112, 113, 114 have the same amplitude level. The phase interpolator has a digital control signal, and is capable of producing a number of output signals, each having specific and discrete phases within the phase range P of the phase interpolator (e.g., phases 121, 122, 123, 124, . . . ), by using the digital control signal. In other words, an output signal can be set to a number of different phases (e.g., phases 121, 122, 123, 124, . . . ). Typically, but not necessarily, the same digital control signal is used for each output so that there is a fixed phase difference between the adjacent output signal phases equidistantly spaced in the phase range P. In FIG. 1, each signal (reference or output) is represented by a directed line segment. The angle of the line segment around the circle corresponds to the phase $\phi$ of the signal. Note that since an output signal can be set to a number of different phases, in FIG. 1, line segments 121, 122, 123, 124, . . . may represent the different phases of a specific output signal.

The digital control signal may have a value represented using a binary number. The number of bits used to represent the digital control signal determines how may different phases may be produced by a phase interpolator (i.e., how many different phases an output signal can be set to). The larger number of bits used to represent the digital control signal, the larger number of different phases can be produced by the phase interpolator, and vise versa. As one example, suppose that the digital control signal is represented using seven (7) bits. Applying this 7-bit control signal to the phase interpolator illustrated in FIG. 1, the higher two (2) bits may be used to represent the sections within the phase range, while the lower five (5) bits may be used to represent the phases within each section. More specifically, for the higher two bits that represent the sections, "00" may indicate section 131 (between 0° and 90°); "01" may indicate section 132 (between 90° and 180°); "10" may indicate section 133 (between 180° and 270°); and "11" may indicate section 134 (between 270° and 360°). The lower five bits are used to represent the phases within each section, and five bits can represent up to 32 ($2^5$=32) distinct input values. Thus, with a 7-bit control signal, the phase interpolator can produce up to 128 (4×32=128 or $2^7$=128) different output phases. In other words, a specific output signal can be set to 128 different phases.

Phase interpolators are usually among the most critical components in high speed communication systems. High-speed phase interpolators often require use of multiple phases of high frequency reference clock input with low mutual phase error and low noise. However, distributing such high frequency and high quality reference clock signals can have negative impact on power and implementation cost. Particular embodiments herein describe a high-performance and low-power phase interpolator using a single reference clock phase.

Particular embodiments may utilize a ring voltage-controlled oscillator (VCO) to generate a set of output signals of a phase interpolator, each having a specific and discrete phase within the phase range of the phase interpolator. Particular embodiments may contemplate any suitable multistage VCO to generate a set of output signals of a phase interpolator. For example and without limitation, particular embodiments may utilize rotary wave traveling oscillators or a multistage inductance-capacitance (LC) VCO to generate a set of output signals of a phase interpolator, each having a specific and discrete phase within the phase range of the phase interpolator.

Figure 2:
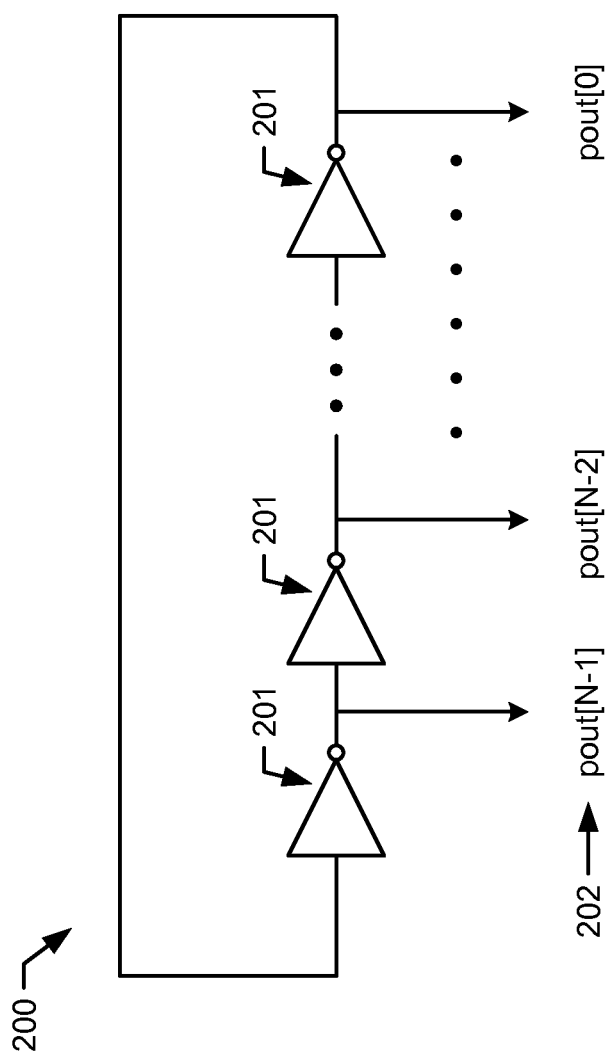
FIG. 2 illustrates an example ring voltage-controlled oscillator.

FIG. 2 illustrates an example ring VCO. In the example of FIG. 2 ring VCO 200 may comprise a plurality of delay elements 201 forming a ring oscillator. For example and without limitation, delay element 201 can be a complementary metal-oxide-semiconductor (CMOS) inverter or a fully-differential amplifier. Particular embodiments contemplate any type of delay element suitable for a ring VCO. For example, a frequency $f_{VCO}$ of ring VCO 200 can be $$f_{VCO} = \frac{1}{2 \times N \times t_d},$$

wherein N is a total number of delay elements 201 of ring VCO 200, while $t_d$ is a time delay for each delay element 201. Since the frequency $f_{VCO}$ is a function of the time delay $t_d$ for each delay element 201, while the time delay $t_d$ can be adjusted by varying a supply voltage to delay elements 201, the frequency $f_{VCO}$ can be adjusted by varying the supply voltage to delay elements 201. In addition, intermediate signals 202 (e.g., pout[N-1], pout[N-2], ..., and pout[0]) between each adjacent pair of delay elements 301 can have the same frequency $f_{VCO}$ and a phase difference of $$\frac{1}{2 \times N}.$$

Figure 3:
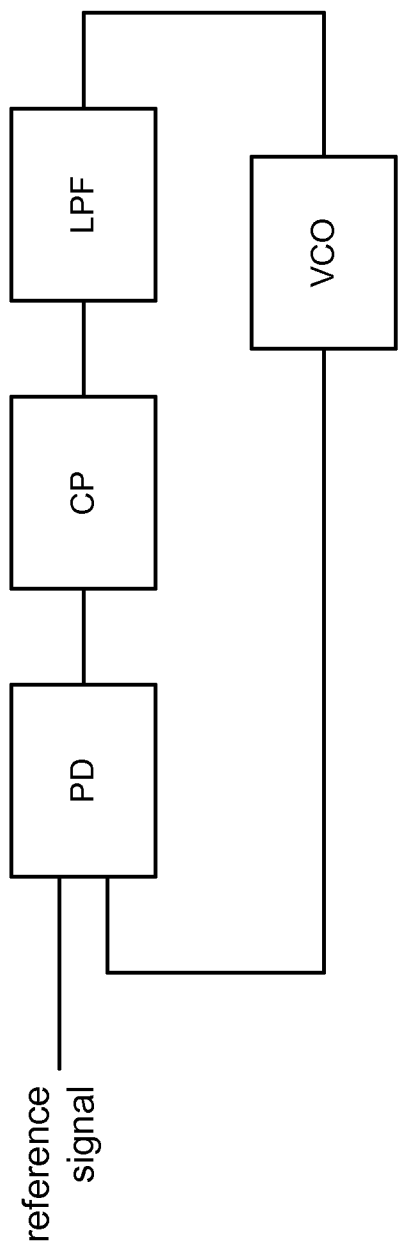
FIG. 3 illustrates an example feedback loop.

For example, for a 5-stage ring VCO (N=5), intermediate signals pout[4], pout[3], pout[2], pout[1], and pout[0] can have phases of 0°, 216° (=1×36°+180°), 72° (=2×36°), 288° (=3×36°+180°, and 144° (=4×36°), respectively. The phases of intermediate signals 201 can be locked to a reference signal by using a typical feedback loop comprising a phase detector (PD), a charge pump (CP) and a low-pass filter (LPF), as illustrated in FIG. 3.

Figure 4A:
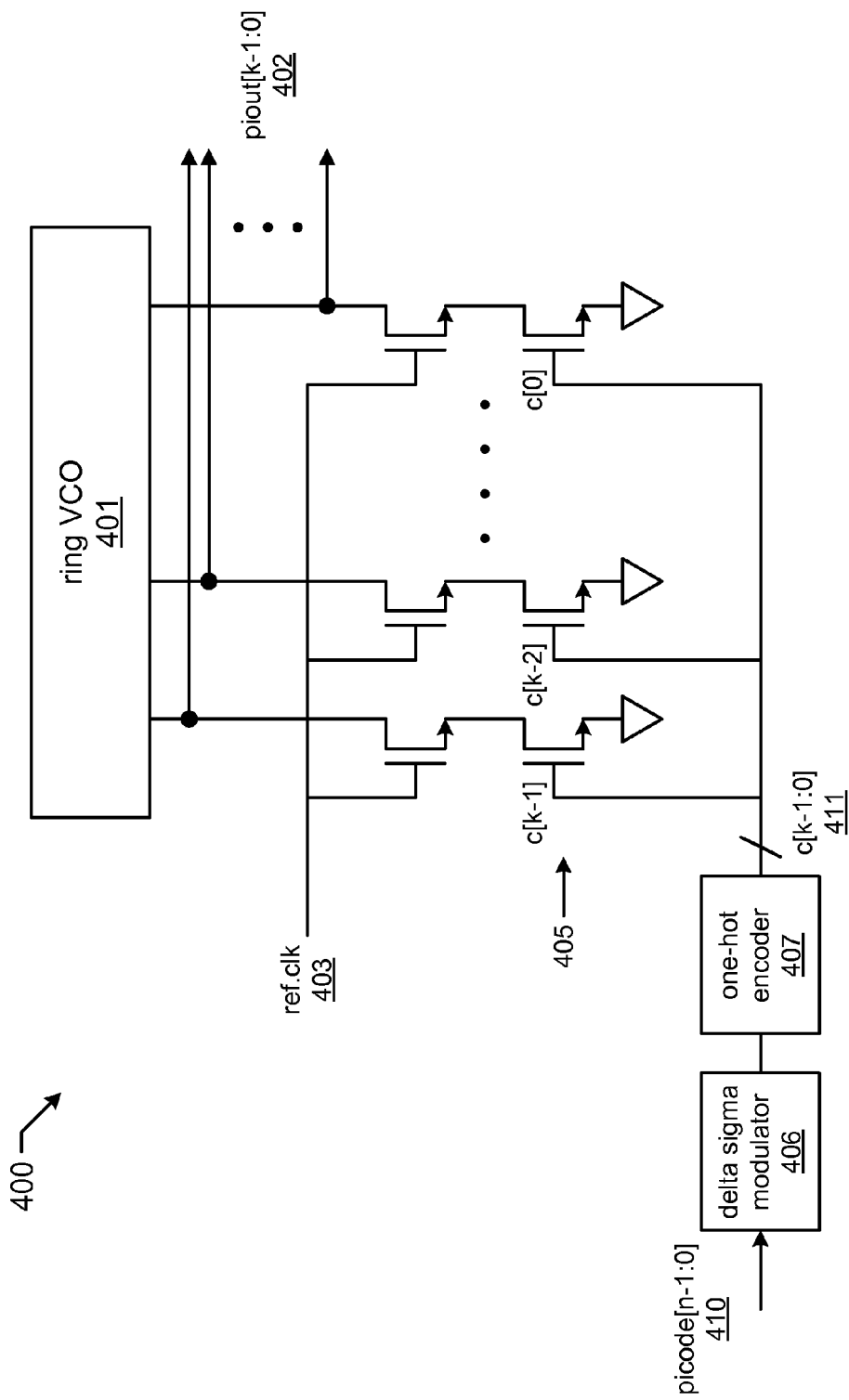
FIG. 4A illustrates an example phase interpolator based on ring voltage-controlled oscillator injection-lock.

FIG. 4A illustrates an example phase interpolator based on ring VCO injection-lock. In particular embodiments, phase interpolator 400 may comprise ring VCO 401. In particular embodiments, phase interpolator 400 may generate k output signals piout[k-1:0] (402), each having a specific and discrete phase within a phase range of phase interpolator 400. In particular embodiments, phase interpolator 400 may generate output signals 402 based on intermediate signals between adjacent pairs of delay elements of ring VCO 401—i.e., each output signal 402 is electrically connected to an intermediate signal between an adjacent pair of delay elements of ring VCO 401 (e.g., an intermediate signal 202 illustrated in FIG. 2). In some embodiments, output signals 402 may utilize all of the intermediate signals—i.e., the total number of output signals 402 can be equal to the total number of the delay elements of ring VCO 401. In other embodiments, output signals 402 may utilize a subset of the intermediate signals—i.e., the total number of output signals 402 can be less than the total number of the delay elements of ring VCO 401. Particular embodiments may align a phase of output signals 402 close to (but not necessarily identical to) a phase of reference clock 403. For example, one or more phases of output signals 402 can be locked to reference clock 403 by using the feedback loop illustrated in FIG. 3.

In particular embodiments, each output signal piout[i] may be selectively coupled to a phase of reference clock 403 based on an n-bit digital control signal or control code picode[n-1:0] (410). In particular embodiments, delta-sigma modulator 406 and one-hot encoder 407 may convert the n-bit control code picode[n-1:0] (410) into a coupling control signal c[k-1:0] of k-bit wide (411). In particular embodiments, each bit c[i] of coupling control signal 411 may selectively couple an output signal piout[i] inversely to a phase of reference clock 403 by turning on/off pass gate 405 (e.g., an N-type metal-oxide-semiconductor or NMOS transistor), as illustrated in FIG. 4A. Particular embodiments contemplate any circuit configuration suitable for selectively coupling an output signal piout[i] to a phase of reference clock 403. By selectively coupling an output signal piout[i] to a phase of reference clock 403, particular embodiments may enable phase interpolation by generating output signals piout[k-1:0] with a set of discrete phases determined by a number of delay stages of ring VCO 401. For example, for a 5-stage ring VCO as described earlier, output signals piout[k-1:0] may comprises phases of 0°, 216°, 72°, 288°, and 144°, aligned to reference clock 403.

Particular embodiments can enable phase interpolation with a resolution higher than a number of phases available for the ring VCO 401. In particular embodiments, delta-sigma modulator 406 may over-sample control code 410. That is, delta sigma modulator 406 (in conjunction with one-hot encoder 407) may convert an n-bit control code (410) into a k-bit wide coupling control signal (411), wherein n>k. Assuming for the purpose of illustration, control code 410 is 6-bit long and control code 411 is 4-bit wide. If control code 410 has a value of "abcd00", wherein "a", "b", "c", and "d" are of binary values, then coupling control code 411 may have a value of "abcd" for most of the time. If control code 410 has a value of "abcd01", then the value of coupling control code 411 may fluctuate between "abcd" (e.g., for every three out of four samples of control code 410) and "abcd+1" (e.g., for every one of four samples of control code 410). By selectively coupling one or more output signals 402 to reference clock 403 over a period of time, particular embodiments may cause a phase in between two adjacent phases of ring VCO 401 to be injection-locked to reference clock 403.

Figure 4B:
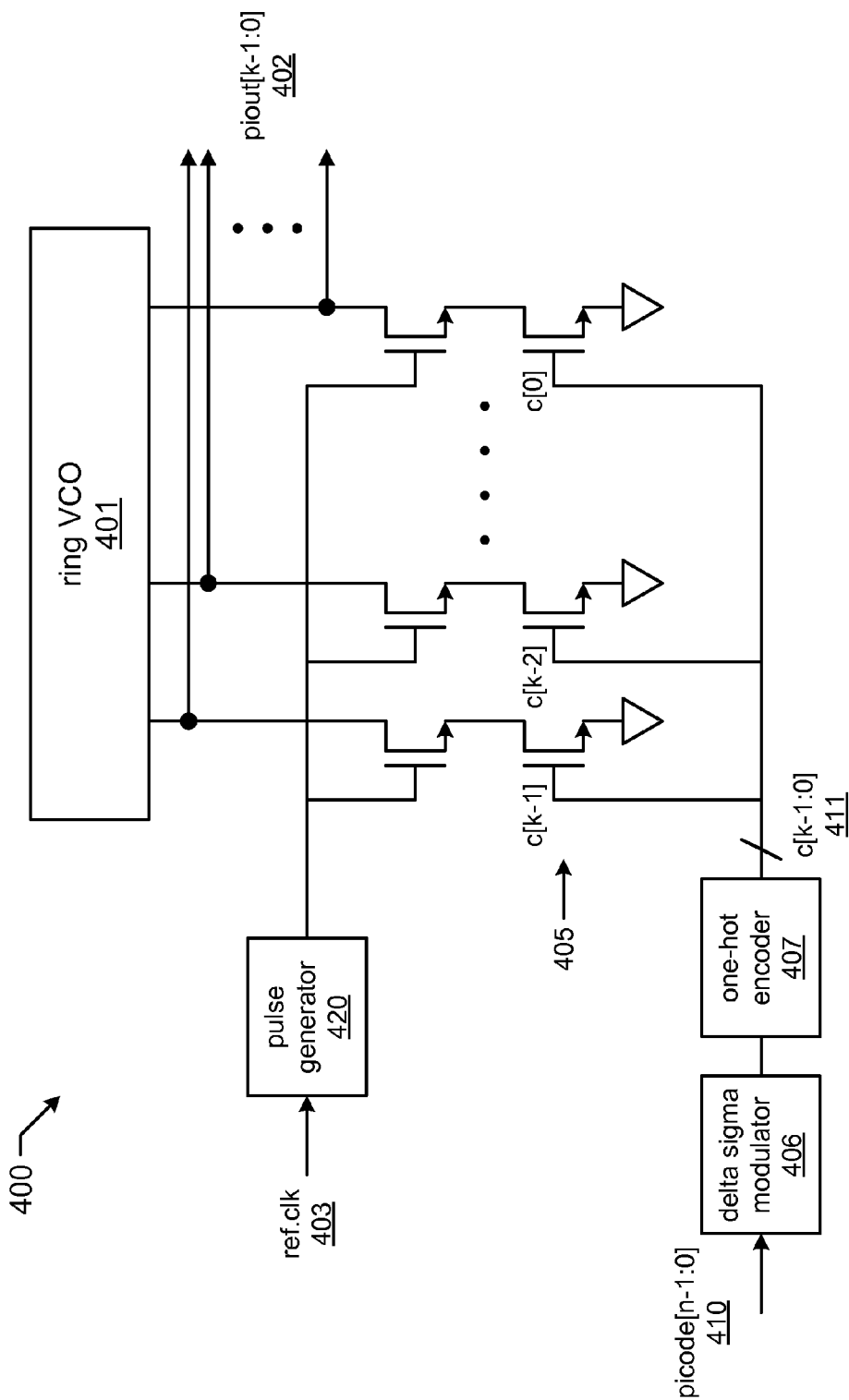
FIG. 4B illustrates another example of the phase interpolator based on ring voltage-controlled oscillator injection-lock.

FIG. 4B illustrates another example phase interpolator based on ring VCO injection-lock. In the example of FIG. 4B, pulse generator 420 may generate pulses corresponding to rising or falling edges of reference clock 403. That is, output signals 402 can be locked to edges of reference clock 403 by coupling to reference clock 403 during each pulse generated by pulse generator 420. The example phase interpolator of FIG. 4B can be used when the frequency of reference clock 403 is different from the frequency of ring VCO 401.

Particular embodiments may also allow for rotation of control codes of a phase interpolator, which is often used in plesiochronous communication systems. For example, a reference clock of a receiving circuit of a plesiochronous communication system may be slightly different (e.g., within a few hundred parts per million) than a reference clock of a transmitting circuit of the plesiochronous communication system. Particular embodiments may allow rotation of control codes of a phase interpolator of a clock-data recovery circuit in order to track a moving phase of transmitted data.

Figure 5:
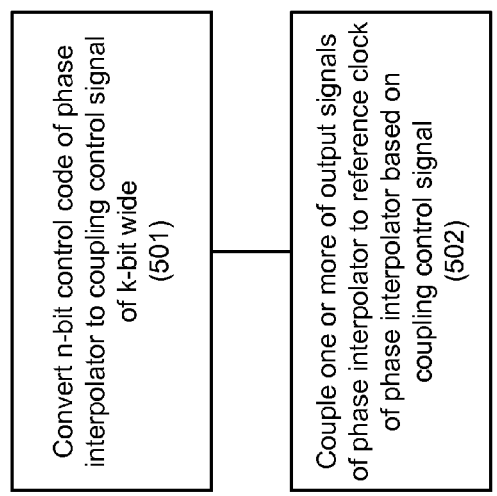
FIG. 5 illustrates an example method for phase interpolation based on ring voltage-controlled oscillator injection-lock.

FIG. 5 illustrates an example method of phase interpolation based on ring voltage-controlled oscillator injection-lock. In particular embodiments, one or more circuits may convert an n-bit control code of a phase interpolator to a coupling control signal of k-bit wide (501). The phase interpolator may have the n-bit control code and a reference clock as input signals and k output signals. Each of the k output signals may have a specific and discrete phase within a phase range of the phase interpolator. The phase interpolator may comprise a multi-stage voltage-controlled oscillator. For example and without limitation, the multistage voltage-controlled oscillator may comprise a ring voltage-controlled oscillator. The multistage voltage-controlled oscillator may comprise a plurality of delay elements, wherein k intermediate signals between k adjacent pairs of the delay elements being respectively connected to the k output signals. The one or more circuits may comprise a delta-sigma modulator and a one-hot encoder to convert the n-bit control code to a coupling control signal of k-bit wide. In particular embodiments, the one or more circuit may couple one or more of the output signals to the reference clock based on the coupling control signal (502). Each bit of the coupling control signal may cause the one or more circuit to couple a respective output signal to the reference clock. In some embodiments, the one or more circuits may comprise a pulse generator configured to generate pulses corresponding to rising or falling edges of the reference clock. Particular embodiments may repeat the steps of the method of FIG. 5, where appropriate. Moreover, although this disclosure describes and illustrates particular steps of the method of FIG. 5 as occurring in a particular order, this disclosure contemplates any suitable steps of the method of FIG. 5 occurring in any suitable order. Furthermore, although this disclosure describes and illustrates particular components, devices, or systems carrying out particular steps of the method of FIG. 5, this disclosure contemplates any suitable combination of any suitable components, devices, or systems carrying out any suitable steps of the method of FIG. 5.

Herein, reference to a computer-readable non-transitory storage medium may include a semiconductor-based or other integrated circuit (IC) (such as, for example, a field-programmable gate array (FPGA) or an application-specific IC (ASIC)), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, another suitable computer-readable non-transitory storage medium, or a suitable combination of these, where appropriate. A computer-readable non-transitory storage medium may be volatile, non-volatile, or a combination of volatile and non-volatile, where appropriate.

This disclosure contemplates one or more computer-readable storage media implementing any suitable storage. In particular embodiments, a computer-readable storage medium implements one or more portions of processor (such as, for example, one or more internal registers or caches), one or more portions of memory, one or more portions of storage, or a combination of these, where appropriate. In particular embodiments, a computer-readable storage medium implements RAM or ROM. In particular embodiments, a computer-readable storage medium implements volatile or persistent memory. In particular embodiments, one or more computer-readable storage media embody software. Herein, reference to software may encompass one or more applications, bytecode, one or more computer programs, one or more executables, one or more instructions, logic, machine code, one or more scripts, or source code, and vice versa, where appropriate. In particular embodiments, software includes one or more application programming interfaces (APIs). This disclosure contemplates any suitable software written or otherwise expressed in any suitable programming language or combination of programming languages. In particular embodiments, software is expressed as source code or object code. In particular embodiments, software is expressed in a higher-level programming language, such as, for example, C, Perl, or a suitable extension thereof. In particular embodiments, software is expressed in a lower-level programming language, such as assembly language (or machine code). In particular embodiments, software is expressed in JAVA, C, or C++. In particular embodiments, software is expressed in Hyper Text Markup Language (HTML), Extensible Markup Language (XML), or other suitable markup language.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A circuit comprising:
  a phase interpolator configured to receive an n-bit control code and a reference clock as input signals and to output k output signals that each have a specific and discrete phase within a phase range, wherein n>k;
  the phase interpolator comprising:
    a multistage voltage-controlled oscillator (VCO) comprising a plurality of delay elements, the multistage VCO configured to have k intermediate signals between k adjacent pairs of the delay elements and to connect the intermediate signals respectively to the output signals; and
    one or more circuit elements configured to convert the n-bit control code to a coupling-control signal that is k bits wide and to couple one or more of the output signals to the reference clock based on the coupling-control signal.

2. A circuit comprising:
  a phase interpolator configured to receive an n-bit control code and a reference clock as input signals and to output k output signals that each have a specific and discrete phase within a phase range;
  the phase interpolator comprising:
    a multistage voltage-controlled oscillator (VCO) comprising a plurality of delay elements, the multistage VCO configured to have k intermediate signals between k adjacent pairs of the delay elements and to connect the intermediate signals respectively to the output signals; and
    a delta-sigma modulator and a one-hot encoder;
    one or more circuit elements configured to convert the n-bit control code to a coupling-control signal that is k bits wide and to couple one or more of the output signals to the reference clock based on the coupling-control signal.

3. A circuit comprising:
  a phase interpolator configured to receive an n-bit control code and a reference clock as input signals and to output k output signals that each have a specific and discrete phase within a phase range;

the phase interpolator comprising:
- a multistage voltage-controlled oscillator (VCO) comprising a plurality of delay elements, the multistage VCO configured to have k intermediate signals between k adjacent pairs of the delay elements and to connect the intermediate signals respectively to the output signals; and
- one or more circuit elements configured to convert the n-bit control code to a coupling-control signal that is k bits wide and to couple one or more of the output signals to the reference clock based on the coupling-control signal;
- wherein each bit of the coupling-control signal is configured to cause the one or more circuit elements to couple a respective output signal to the reference clock.

4. A circuit comprising:
a phase interpolator configured to receive an n-bit control code and a reference clock as input signals and to output k output signals that each have a specific and discrete phase within a phase range;
the phase interpolator comprising:
- a multistage voltage-controlled oscillator (VCO) comprising a plurality of delay elements, the multistage VCO configured to have k intermediate signals between k adjacent pairs of the delay elements and to connect the intermediate signals respectively to the output signals;
- a pulse generator that is configured to generate pulses corresponding to rising or falling edges of the reference clock; and
- one or more circuit elements configured to convert the n-bit control code to a coupling-control signal that is k bits wide and to couple one or more of the output signals to the reference clock based on the coupling-control signal.

5. The circuit of claim 1, wherein the multistage VCO comprises a ring VCO.

6. The circuit of claim 1, wherein k is less than a total number of the delay elements.

7. A method comprising:
converting an n-bit control code of a phase interpolator to a coupling-control signal that is k bits wide, the phase interpolator having the n-bit control code and a reference clock as input signals and having k output signals, each of the output signals having a specific and discrete phase within a phase range, the phase interpolator comprising a multistage voltage-controlled oscillator (VCO) that comprises a plurality of delay elements and has k intermediate signals between k adjacent pairs of the delay elements, the intermediate signals being respectively connected to the output signals, the phase interpolator further comprising a delta-sigma modulator and a one-hot encoder; and
coupling one or more of the output signals to the reference clock based on the coupling-control signal.

8. The method of claim 7, wherein n>k.

9. The method of claim 7, wherein each bit of the coupling-control signal causes the phase interpolator to couple a respective output signal to the reference clock.

10. The method of claim 7, wherein the multistage VCO comprises a ring VCO.

11. A method comprising:
converting an n-bit control code of a phase interpolator to a coupling-control signal that is k bits wide, the phase interpolator having the n-bit control code and a reference clock as input signals and having k output signals, each of the output signals having a specific and discrete phase within a phase range, the phase interpolator comprising a multistage voltage-controlled oscillator (VCO) that comprises a plurality of delay elements and has k intermediate signals between k adjacent pairs of the delay elements, the intermediate signals being respectively connected to the output signals, the phase interpolator further comprising a pulse generator that is configured to generate pulses corresponding to rising or falling edges of the reference clock; and
coupling one or more of the output signals to the reference clock based on the coupling-control signal.

12. The method of claim 7, wherein k is less than a total number of the delay elements.

13. A circuit comprising:
a phase interpolator configured to receive an n-bit control code and a reference clock as input signals and to output k output signals that each have a specific and discrete phase within a phase range, n being greater than k;
the phase interpolator comprising:
- a ring voltage-controlled oscillator (VCO) comprising a plurality of delay elements, the ring VCO being configured to have k intermediate signals between k adjacent pairs of the delay elements and to connect the intermediate signals respectively to the output signals, k being less than a total number of the delay elements;
- a pulse generator configured to generate pulses corresponding to rising or falling edges of the reference clock;
- a delta-sigma modulator and a one-hot encoder configured to convert the n-bit control code to a coupling-control signal that is k bits wide; and
- one or more circuit elements to couple, based on each bit of the coupling-control signal, a respective output signal to the reference clock.

* * * * *